United States Patent
Nishimura et al.

(10) Patent No.: US 10,707,831 B2
(45) Date of Patent: Jul. 7, 2020

(54) RESONATOR

(71) Applicant: Murata Manufacturing Co., Ltd., Nagaokakyo-shi, Kyoto-fu (JP)

(72) Inventors: Toshio Nishimura, Nagaokakyo (JP); Yuichi Goto, Nagaokakyo (JP); Daisuke Nakamura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 691 days.

(21) Appl. No.: 15/483,161

(22) Filed: Apr. 10, 2017

(65) Prior Publication Data

US 2017/0222621 A1 Aug. 3, 2017

Related U.S. Application Data

(63) Continuation of application No. PCT/JP2016/050545, filed on Jan. 8, 2016.

(30) Foreign Application Priority Data

Jan. 16, 2015 (JP) .................................. 2015-007029

(51) Int. Cl.
*H01L 41/053* (2006.01)
*H01L 41/047* (2006.01)
(Continued)

(52) U.S. Cl.
CPC ........ *H03H 9/132* (2013.01); *H03H 9/02338* (2013.01); *H03H 9/05* (2013.01);
(Continued)

(58) Field of Classification Search
CPC ...... H03H 9/132; H03H 9/02338; H03H 9/05; H03H 9/1057; H03H 9/17; H03H 9/2452
(Continued)

(56) References Cited

U.S. PATENT DOCUMENTS 5,430,342 A * 7/1995 Watson .............. G01C 19/5642
310/316.01
5,541,469 A 7/1996 Kaida
(Continued)

FOREIGN PATENT DOCUMENTS

JP 54092089 A * 7/1979 ........... H03H 9/0595
JP H07-007361 A 1/1995
(Continued)

OTHER PUBLICATIONS

International Search Report issued in International Application No. PCT/JP2016/050545, dated Apr. 5, 2016.
(Continued)

*Primary Examiner* — Thomas M Dougherty
(74) *Attorney, Agent, or Firm* — Arent Fox LLP (57) ABSTRACT

A resonator includes a support frame, a rectangular vibrating plate that performs contour vibration in a predetermined direction, and two pairs of support arms. The vibrating plate includes four vibration regions arranged in a row in the lengthwise direction and electrodes disposed in the vibration regions. Each of the vibration regions vibrate with a phase opposite to phases with which the adjacent vibration regions vibrate upon excitation. A center line of a pair of the electrodes in the lengthwise direction is offset from a center line, in the lengthwise direction, of a corresponding vibration region that includes the electrode disposed thereon.

20 Claims, 9 Drawing Sheets (51) Int. Cl.
  *H01L 41/09*  (2006.01)
  *H03H 9/13*  (2006.01)
  *H03H 9/02*  (2006.01)
  *H03H 9/24*  (2006.01)
  *H03H 9/10*  (2006.01)
  *H03H 9/05*  (2006.01)
  *H03H 9/17*  (2006.01)
(52) U.S. Cl.
  CPC ............ *H03H 9/1057* (2013.01); *H03H 9/17*
     (2013.01); *H03H 9/2452* (2013.01)
(58) Field of Classification Search
  USPC ........................................ 310/348, 349, 351
  See application file for complete search history.

(56) References Cited

U.S. PATENT DOCUMENTS

| | | | |
|---|---|---|---|
| 6,720,714 B2* | 4/2004 | Ishitoko | G01C 19/56 310/351 |
| 7,639,105 B2 | 12/2009 | Ayazi et al. | |
| 7,843,284 B2 | 11/2010 | Ayazi et al. | |
| 7,924,119 B1 | 4/2011 | Ayazi et al. | |
| 2001/0015594 A1* | 8/2001 | Mori | G01C 19/5663 310/330 |
| 2008/0246559 A1 | 10/2008 | Ayazi et al. | |
| 2010/0066467 A1 | 3/2010 | Ayazi et al. | |
| 2018/0054180 A1* | 2/2018 | Nakamura | H03H 9/02275 |

FOREIGN PATENT DOCUMENTS

| | | | |
|---|---|---|---|
| JP | 2002-076825 A | 3/2002 | |
| JP | 2006-203742 | * 8/2006 | .............. H03H 9/19 |
| JP | 2006-203742 A | 8/2006 | |
| JP | 2008-228195 A | 9/2008 | |

OTHER PUBLICATIONS

Written Opinion of the International Searching Authority issued in International Application No. PCT/JP2016/050545, dated Apr. 5, 2016.

* cited by examiner

RESONATOR

CROSS-REFERENCE TO RELATED APPLICATIONS

The present application is a continuation of PCT/JP2016/050545 filed Jan. 8, 2016, which claims priority to Japanese Patent Application No. 2015-007029, filed Jan. 16, 2015, the entire contents of each of which are incorporated herein by reference.

TECHNICAL FIELD

The present disclosure relates to a resonator.

BACKGROUND

A piezoelectric resonator that vibrates in a so-called width-expansion vibration mode includes a support frame that has, for example, a rectangular shape and a vibrating portion that is disposed in the support frame and that has, for example, a rectangular shape. The vibrating portion includes, for example, four vibration regions that are arranged in a row in a first direction, and stretching vibration, which entails repetitive expansion and contraction, in the first direction occurs as a result of electric fields having opposite phases being alternately applied to the adjacent vibration regions.

The vibrating portion is connected to the support frame by, for example, two pairs of support portions each extending in a second direction, which is perpendicular to the first direction. Each of the two pairs of support portions are respectively connected to, for example, the two adjacent vibration regions that are the inner vibration regions located between the other two vibration regions, which are the outer vibration regions positioned at the opposite sides in the first direction. Each of the support portions is connected to one of the end portions of the corresponding inner vibration region, each of the end portions being defined as a node point, that is, a minimum displacement point, and being located on a center line of the vibration region in the first direction.

Patent Document 1: U.S. Pat. No. 7,639,105,
Patent Document 2: Japanese Unexamined Patent Application Publication No. 2008-228195, It was found that, since the vibration regions are disposed on opposite sides of each of the adjacent inner vibration regions, as a result of each of the inner vibration regions being influenced by displacement of the vibration regions disposed on opposite sides thereof, neither of the end portions on the center lines of the inner vibration regions in the first direction serve as a node point. Consequently, even if the support portions are connected to the end portions on the center lines of the inner vibration regions, sufficient resonator characteristics are not obtainable.

SUMMARY OF INVENTION

The present disclosure has been made in view of the above situation, and provides a resonator having resonator characteristics that are further improved compared with the conventional designs.

A resonator according to an exemplary aspect includes a support frame, a rectangular vibrating plate that has a first side and a second side, which extend in a predetermined direction so as to be parallel to each other, and that performs contour vibration in a predetermined direction, and two pairs of support arms that connect the first side and the second side of the vibrating portion and the support frame to one another. The vibrating plate includes at least four vibration regions arranged in a row in the predetermined direction, each of the at least four vibration regions being configured to vibrate with a phase opposite to phases with which the adjacent vibration regions vibrate, and electrode films, each of which is formed so as to be included in one of the vibration regions. A center line of each of the electrode films in the predetermined direction is displaced from a center line of a corresponding one of the vibration regions in the predetermined direction, the corresponding one of the vibration regions including the electrode film.

A resonator according to another exemplary aspect includes a support frame, a rectangular vibrating plate portion that has a first side and a second side, which extend in a predetermined direction so as to be parallel to each other, and that performs contour vibration in a predetermined direction, and two pairs of support arms that connect the first side and the second side of the vibrating portion and the support frame to one another. The vibrating plate includes at least four vibration regions arranged in a row in the predetermined direction, each of the at least four vibration regions being configured to vibrate with a phase opposite to phases with which the adjacent vibration regions vibrate. A center line of each of the support portions in the predetermined direction is displaced from a center line of a corresponding one of the vibration regions in the predetermined direction, the corresponding one of the vibration regions being connected to the support portion.

According to the present disclosure, a resonator having resonator characteristics that are further improved compared with the conventional resonator designs is provided.

DETAILED DESCRIPTION OF EMBODIMENTS

Figure 1:
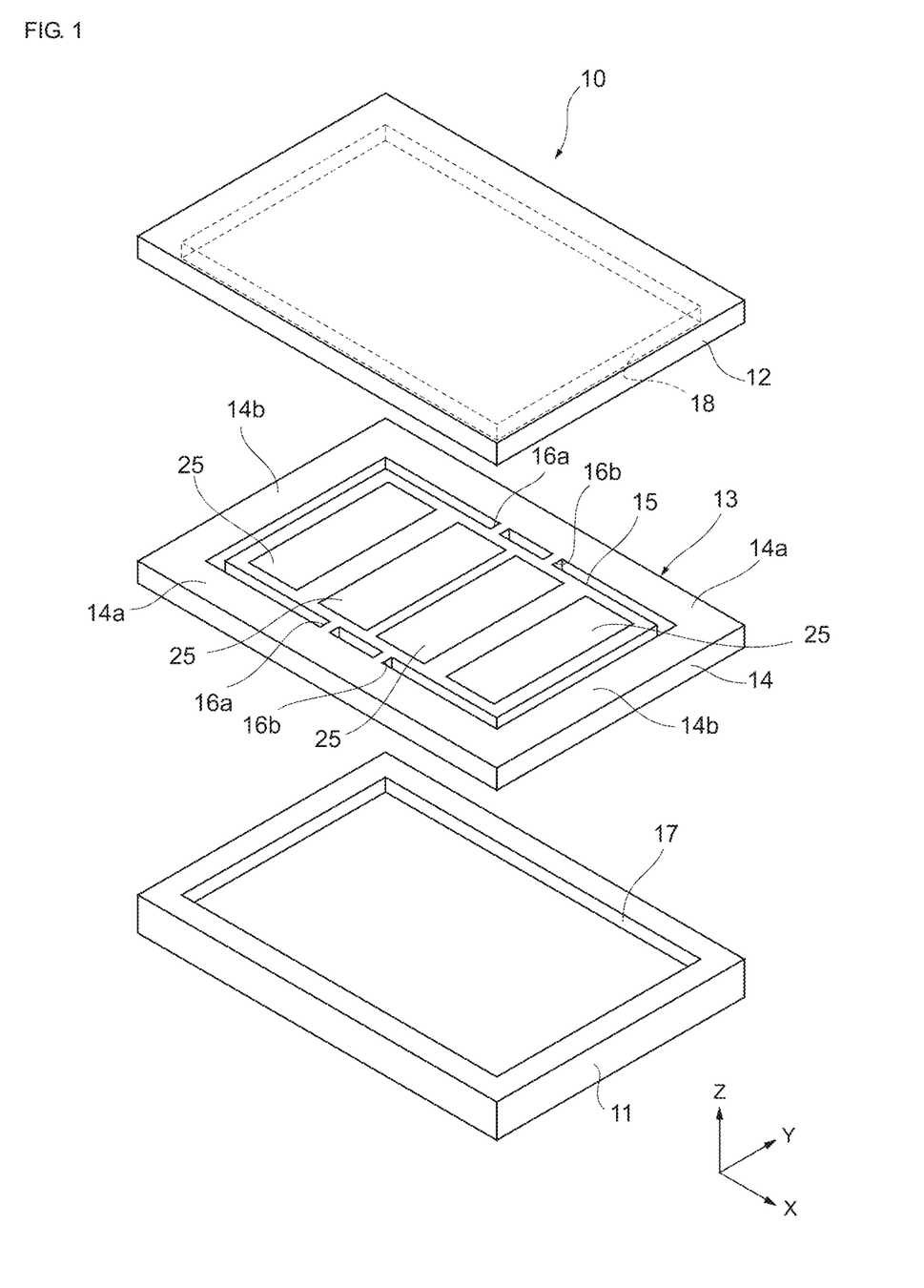
FIG. 1 is an exploded perspective view schematically illustrating the structure of a piezoelectric vibration device according to a specific example.

A first embodiment will be described below with reference to the accompanying drawings. FIG. 1 is an exploded perspective view schematically illustrating the structure of a piezoelectric vibration device 10 according to a specific example. The piezoelectric vibration device 10 has, for example, a flat rectangular parallelepiped shape as its contour shape and includes a lower substrate 11, an upper substrate 12 that forms a vibration space between the lower substrate 11 and the upper substrate 12, and a piezoelectric vibrator (an example of a resonator) 13 that is sandwiched and held between the lower substrate 11 and the upper substrate 12. The piezoelectric vibrator 13 is a MEMS vibrator manufactured by using MEMS technology.

The piezoelectric vibrator 13 includes a support frame 14 extending along an XY plane of the rectangular coordinate system of FIG. 1 so as to have, for example, a rectangular frame-like shape, a vibrating portion 15 (also referred to as a "vibration plate") disposed inside the support frame 14, the vibrating portion 15 extending, for example, along the XY plane in a similar manner to the support frame 14 so as to have a rectangular shape, and at least one pair of support arms or support portions connecting the support frame 14 and the vibrating portion 15 to each other. In the present embodiment, the piezoelectric vibrator 13 includes one pair of support portions 16a and 16a and one pair of support portions 16b and 16b, that is, two pairs of support portions. The terms support portions and support arms are used interchangeably herein.

The support frame 14 includes a pair of long-side frame bodies 14a and 14a extending in a direction parallel to the X-axis (i.e., a first direction, shown as the lengthwise direction) and a pair of short-side frame bodies 14b and 14b extending in a direction parallel to the Y-axis (i.e., a second direction, shown as the widthwise direction). The ends of the short-side frame bodies 14b and 14b being connected to the ends of the long-side frame bodies 14a and 14a. The vibrating portion 15 has first and second long sides extending in the X-axis direction so as to be parallel to each other, and the first and second sides extend parallel to the frame bodies 14a and 14a. The pair of support portions 16a and 16a and the pair of support portions 16b and 16b each extend in a straight line parallel to the Y-axis and connect the frame bodies 14a and 14a and the vibrating portion 15 to one another.

The lower substrate 11 extends along the XY plane so as to have a flat plate-like shape, and a recess 17 having, for example, a flat rectangular parallelepiped shape is formed in the top surface of the lower substrate 11. The recess 17 forms part of the vibration space of the vibrating portion 15. The upper substrate 12 extends along the XY plane so as to have a flat plate-like shape, and a recess 18 having, for example, a flat rectangular parallelepiped shape is formed in the lower surface of the upper substrate 12. The recess 18 forms part of the vibration space of the vibrating portion 15. In the vibration space, a vacuum state is maintained. The lower substrate 11 and the upper substrate 12 are made of, for example, silicon (Si).

Figure 2:
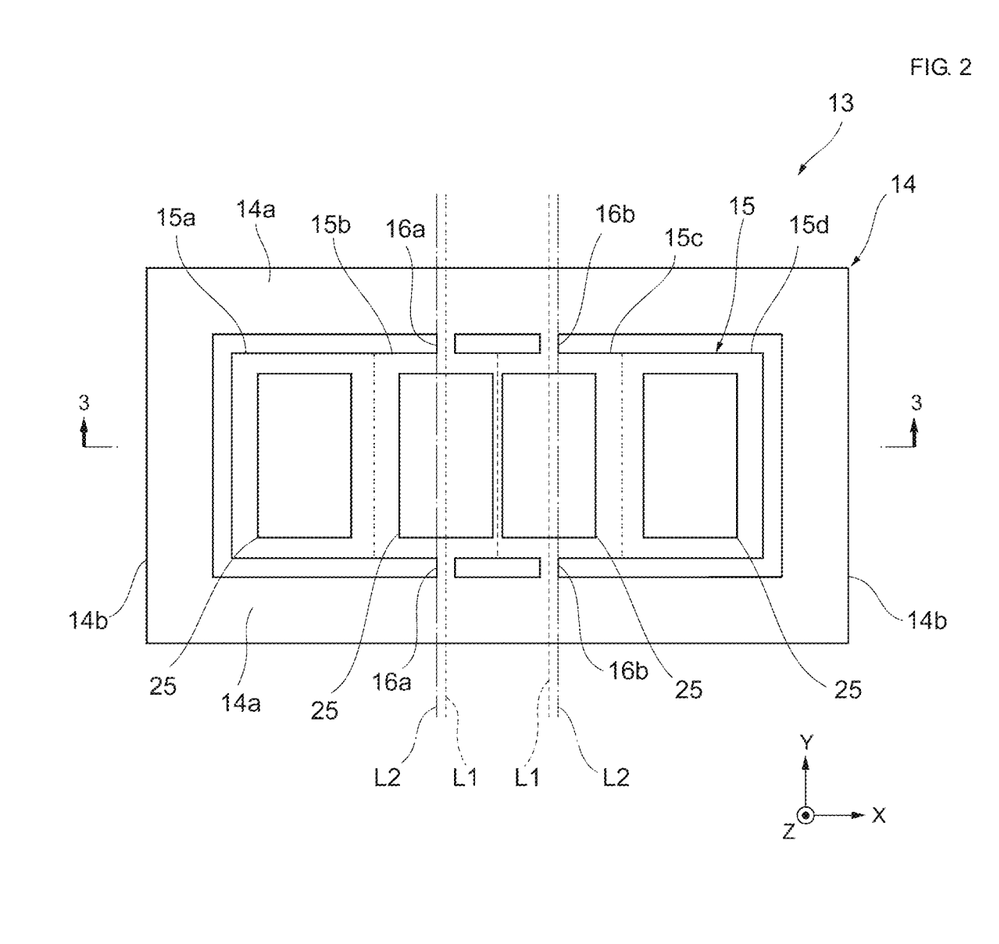
FIG. 2 is a plan view schematically illustrating the structure of a piezoelectric vibrator according to a first embodiment.

FIG. 2 is a plan view schematically illustrating the structure of the piezoelectric vibrator 13 according to the first embodiment. As illustrated in FIG. 2, the vibrating portion 15 has a plurality of vibration regions, that is, four vibration regions 15a to 15d that are arranged in a row in a predetermined direction, that is, the X-axis direction and can be considered the first direction. In FIG. 2, the vibration regions 15a to 15d are separated from one another by dotted lines. In the present embodiment, the vibration regions 15a to 15d have the same width in the X-axis direction and the same length in the Y-axis direction, i.e., the second direction perpendicular to the first direction. In other words, the vibration regions 15a to 15d define a region divided into four equal regions in the X-axis direction. In addition, as will be described later, in the vibration regions 15a to 15d, the boundaries between the adjacent vibration regions are each defined by a line that minimizes a deformation amount in the vibrating portion 15.

As described above, the vibrating portion 15 is supported by the support frame 14 with the two pairs of support portions 16a, 16a and 16b, 16b. The pair of support portions 16a and 16a connect the vibration region 15b, which is positioned further inside than the outer vibration region 15a, and frame bodies 14a and 14a to one another. The pair of support portions 16b and 16b connect the vibration region 15c, which is positioned further inside than the outer vibration region 15d, and frame bodies 14a and 14a to one another.

Figure 3:
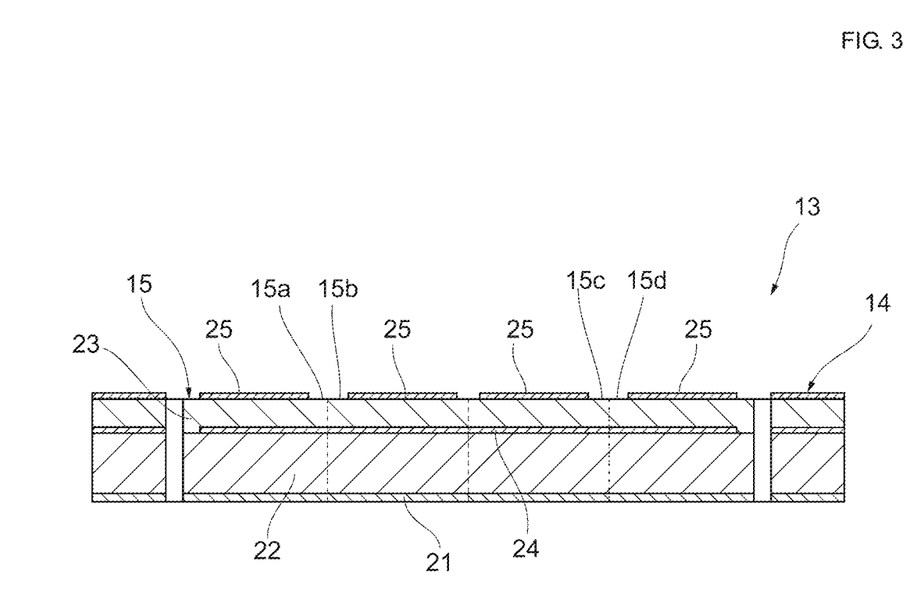
FIG. 3 is a schematic sectional view taken along line 3-3 of FIG. 2.

FIG. 3 is a schematic sectional view taken along line 3-3 of FIG. 2. Referring to FIG. 2 and FIG. 3 together, the vibrating portion 15 includes a Si oxide film 21, an active layer, that is, a Si layer 22 that is stacked on the Si oxide film 21, a piezoelectric thin film 23 that is stacked on the Si layer 22, for example, one lower electrode film 24 that is formed in or on the lower surface of the piezoelectric thin film 23, and a plurality of upper electrode films 25 that are formed in or on the upper surface of the piezoelectric thin film 23. Note that the Si oxide film 21 may be formed in or on the upper or lower surface of the piezoelectric thin film 23.

The Si oxide film 21 is a film for correcting the frequency-temperature characteristics of the piezoelectric vibrator 13, and for example, $SiO_2$ is used for forming the Si oxide film 21. Instead of $SiO_2$, a silicon oxide material containing a suitable composition of a SiaOb layer (a and b are integers) may be used for forming the Si oxide film 21. The Si layer 22 is formed of an n-type Si semiconductor in a degenerate state and includes phosphorus (P) as an n-type dopant. For example, aluminum nitride (AlN) is used for forming the piezoelectric thin film 23. However, instead of AlN, scandium aluminum nitride (ScAlN) or the like may be used for forming the piezoelectric thin film 23.

The lower electrode film 24 is formed across all the vibration regions 15a and 15d and serves as an electrode common to all the vibration regions 15a and 15d. The lower electrode film 24 is formed as a floating electrode. In contrast, the upper electrode films 25 are each formed so as to correspond to one of the vibration regions 15a and 15d. For example, molybdenum (Mo) is used for forming the lower electrode film 24 and the upper electrode films 25. Note that, instead of providing the single lower electrode film 24, a plurality of lower electrode films 24 may each be formed so as to correspond to one of the vibration regions 15a and 15d.

The AlN included in the piezoelectric thin film 23 has a wurtzite structure, and the c-axis thereof is oriented substantially perpendicularly to the Si layer 22. When alternating-current (AC) electric fields are applied to the upper electrode films 25 in the c-axis direction such that the AC electric fields having opposite phases are alternately applied to the adjacent upper electrode films 25, the vibration regions 15a and 15d are mechanically coupled to one another, and as a result, the entire vibrating portion 15 performs harmonic contour vibration. In other words, in the X-axis direction, the vibrating portion 15 vibrates in a width-expansion mode in which the vibrating portion 15 repeatedly expands and contracts.

Returning to FIG. 2, in the outer vibration regions 15a and 15d of the vibrating portion 15, which are positioned at the opposite sides in the X-axis direction, the center line (not illustrated) of each of the vibration regions 15a and 15d in the X-axis direction and the center line (not illustrated) of the corresponding upper electrode film 25 in the X-axis direction coincide with each other. In other words, the two upper electrode films 25 are respectively disposed at the center of the width of the vibration regions 15a and 15d defined in the X-axis direction. In contrast, in the inner vibration regions 15b and 15c, the center lines L1 of the other two upper electrode films 25 in the X-axis direction are arranged to be offset inwardly from the corresponding center lines L2 (indicated by one-dot chain lines) of the vibration regions 15b and 15c in a direction in which the center lines L1 come closer to each other.

In the present embodiment, in the inner vibration regions 15b and 15c, the center lines L1 of the upper electrode films 25 respectively coincide with the center line of the support portions 16a and 16a and the center line of the support portions 16b and 16b in the X-axis direction as is clear from FIG. 2. In other words, in a similar manner to the center lines L1 of the upper electrode films 25, the center line of the pair of support portions 16a and 16a and the center line of the pair of support portions 16b and 16b in the X-axis direction are arranged to be offset inwardly from the corresponding center lines L2 of the vibration regions 15b and 15c in a direction in which the center line of the pair of support portions 16a and 16a and the center line of the pair of support portions 16b and 16b come closer to each other.

In the piezoelectric vibrator 13 according to the present embodiment, for example, the Si layer 22 has a width of 200 μm in the X-axis direction, a length of 74 μm in the Y-axis direction, and a thickness of 10 μm in the Z-axis direction. Each of the support portions 16a and 16b has a width of 5 μm in the X-axis direction and a length of 5 μm in the Y-axis direction. In this case, in the inner vibration regions 15b and 15c, displacement between each of the center lines L1 of the upper electrode films 25 and the support portions 16a and 16b and the corresponding one of center lines L2 of the vibration regions 15b and 15c is set to 2 μm. In addition, the ratio of the width of each of the upper electrode films 25 to the width of the corresponding one of the vibration regions 15a and 15d in the X-axis direction is set to 0.7.

In the piezoelectric vibrator 13, which has been described above, the vibration regions 15a and 15c are arranged adjacent to the vibration region 15b, and the vibration regions 15b and 15d are arranged adjacent to the vibration region 15c. As will be described later, in the verification conducted by the inventors of the present invention, it was found that, as a result of the vibration regions 15b and 15c respectively being influenced by displacement of the adjacent vibration regions located on the opposite sides thereof, the actual minimum displacement point (maximum deformation point) of the vibration region 15b and the actual minimum displacement point (maximum deformation point) of the vibration region 15c were respectively displaced, toward the inside of the vibrating portion 15 in the X-axis direction, from the center line L2 of the vibration region 15b, on which the original minimum displacement point (maximum deformation point) of the vibration region 15b was considered to be present, and the center line L2 of the vibration region 15c, on which the original minimum displacement point (maximum deformation point) of the vibration region 15c was considered to be present.

In the present embodiment, in the inner vibration regions 15b and 15c, the center lines L1 of the corresponding upper electrode films 25 are each displaced toward the inside of the vibrating portion 15, that is, the actual minimum displacement point thereof, and each of the corresponding upper electrode films 25 is formed with its actual maximum deformation point corresponding to its center. Thus, vibration efficiency can be improved, and as a result, vibrator characteristics can be improved. As a result of each of the center lines of the pairs of support portions 16a, 16a and 16b, 16b being displaced toward the inside of the vibrating portion 15, that is, toward the corresponding actual minimum displacement point, such that each of the pairs of support portions 16a, 16a and 16b, 16b is aligned to the corresponding actual minimum displacement point, loss of vibration of the vibration regions 15b and 15c as a result of being supported by the support portions 16a and 16b can be minimized.

Figure 4:
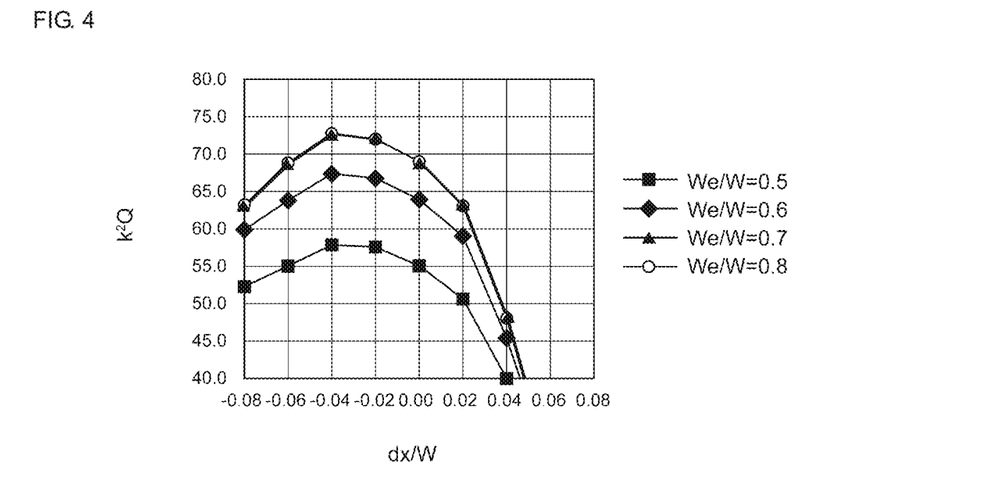
FIG. 4 is a graph representing verification results of an effect of displacement of the center lines of upper electrode films and support portions.
Figure 5:
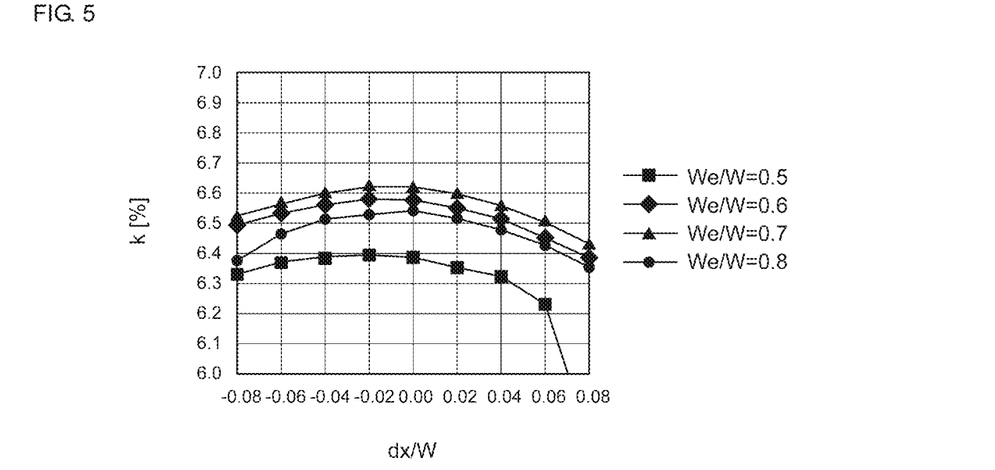
FIG. 5 is another graph representing verification results of the effect of displacement of the center lines of the upper electrode films and the support portions.
Figure 6:
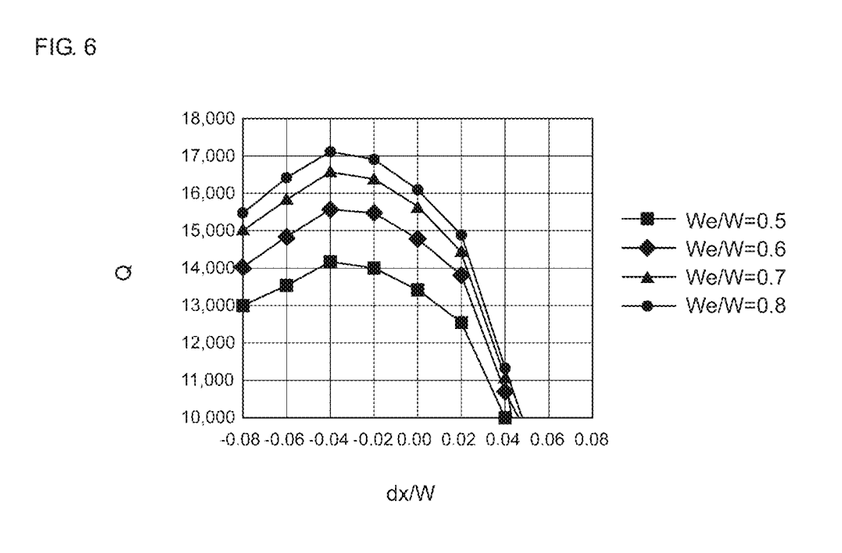
FIG. 6 is another graph representing verification results of the effect of displacement of the center lines of the upper electrode films and the support portions.

FIG. 4 to FIG. 6 are graphs representing verification results of an effect of displacement of the center lines L1 of the upper electrode films 25 and the support portions 16a and 16b from the corresponding center lines L2 based on an analysis simulation using a finite element method (FEM). In each of the graphs of FIG. 4 to FIG. 6, the horizontal axis denotes the ratio dx/W of a displacement amount dx between each of the center lines L1 and the corresponding center line L2 to the width W of the vibration region 15b and 15c in the X-axis direction. In the case where the center line L1 is displaced from the center line L2 toward the outside of the vibrating portion 15, the ratio is a positive value, and in the case where the center line L1 is displaced from the center line L2 toward the inside, the ratio is a negative value. The vertical axes of the graphs respectively denote $k_2Q$, $k$ (electromechanical coupling coefficient), and Q representing the vibrator characteristics of the piezoelectric vibrator.

When the verification was conducted, the ratio dx/W of the displacement amount dx of each of the center lines L1 of the upper electrode films 25 and the support portions 16a and 16b from the corresponding center line L2 of the vibration region 15b and 15c to the width W of the vibration region 15b and 15c in the X-axis direction was varied. As a result, as illustrated in FIG. 4 to FIG. 6, it is understood that the vibrator characteristics are improved when each of the center lines L1 of the upper electrode films 25 and the support portions 16a and 16b is displaced further toward the inside of the vibrating portion 15 than the corresponding center line L2 of the vibration region 15b and 15c. It is understood that the vibrator characteristics are maximally improved when each of the center lines L1 of the upper electrode films 25 and the support portions 16a and 16b is displaced toward the inside at a ratio of, for example, −0.04. In particular, it is clearly understood from FIG. 4 and FIG. 6 that the vibrator characteristics sharply deteriorate when each of the center lines L1 is displaced outwardly from the corresponding center line L2.

Figure 7:
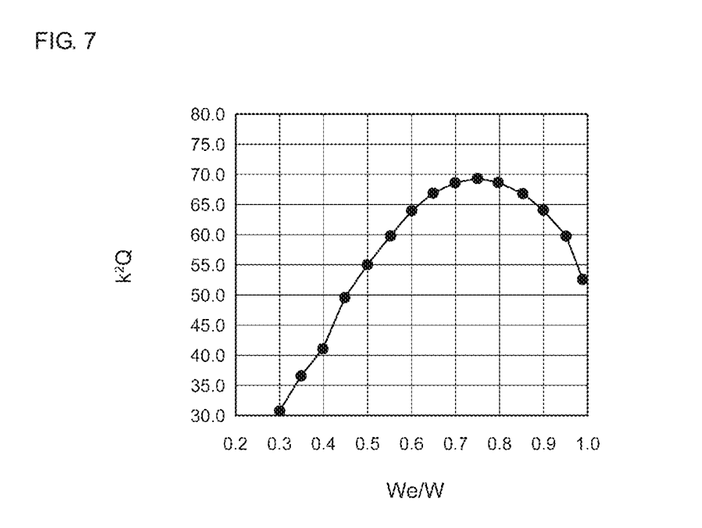
FIG. 7 is a graph representing verification results of an effect of the ratio of the width of each of the upper electrode films to the width of a corresponding one of vibration regions.
Figure 8:
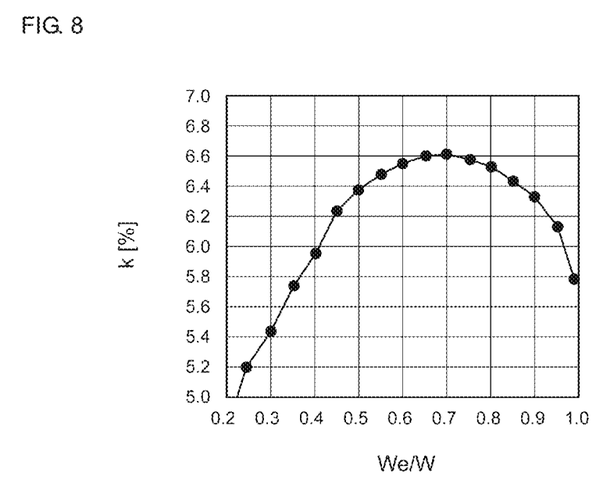
FIG. 8 is another graph representing verification results of the effect of the ratio of the width of each of the upper electrode films to the width of the corresponding vibration region.
Figure 9:
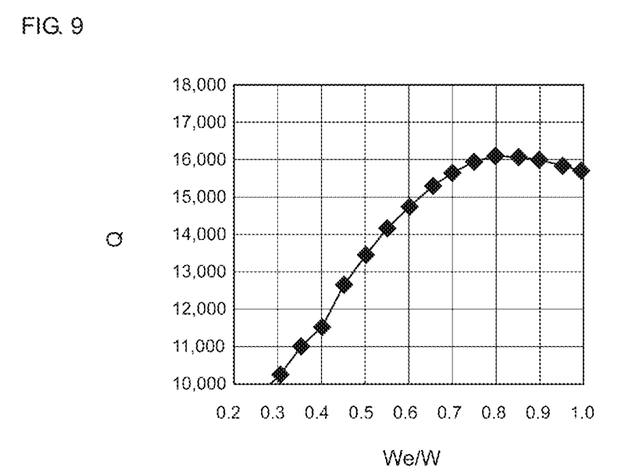
FIG. 9 is another graph representing verification results of the effect of the ratio of the width of each of the upper electrode films to the width of the corresponding vibration region.

FIG. 7 to FIG. 9 are graphs representing verification results of an effect of the ratio of the width We of each of the upper electrode films 25 to the width W of the vibration region 15b and 15c based on an FEM analysis simulation. In each of the graphs, the horizontal axis represents the ratio We/W of the width We of each of the upper electrode films 25 to the width W of the vibration region 15b and 15c. When the verification was conducted, the ratio We/W of the width We of each of the upper electrode films 25 in the X-axis direction to the width W of the vibration region 15b and 15c was varied. As illustrated in FIG. 7 to FIG. 9, it is understood that the vibrator characteristics are mostly favorable when the ratio We/W is set to 0.6 or larger and 0.9 or smaller, and that the vibrator characteristics are particularly favorable when the ratio We/W is set to 0.7 or larger and 0.8 or smaller. Thus, it is understood that the width We of each of the upper electrode films 25 may preferably be set at a ratio within the above-mentioned numerical range.

Figure 10:
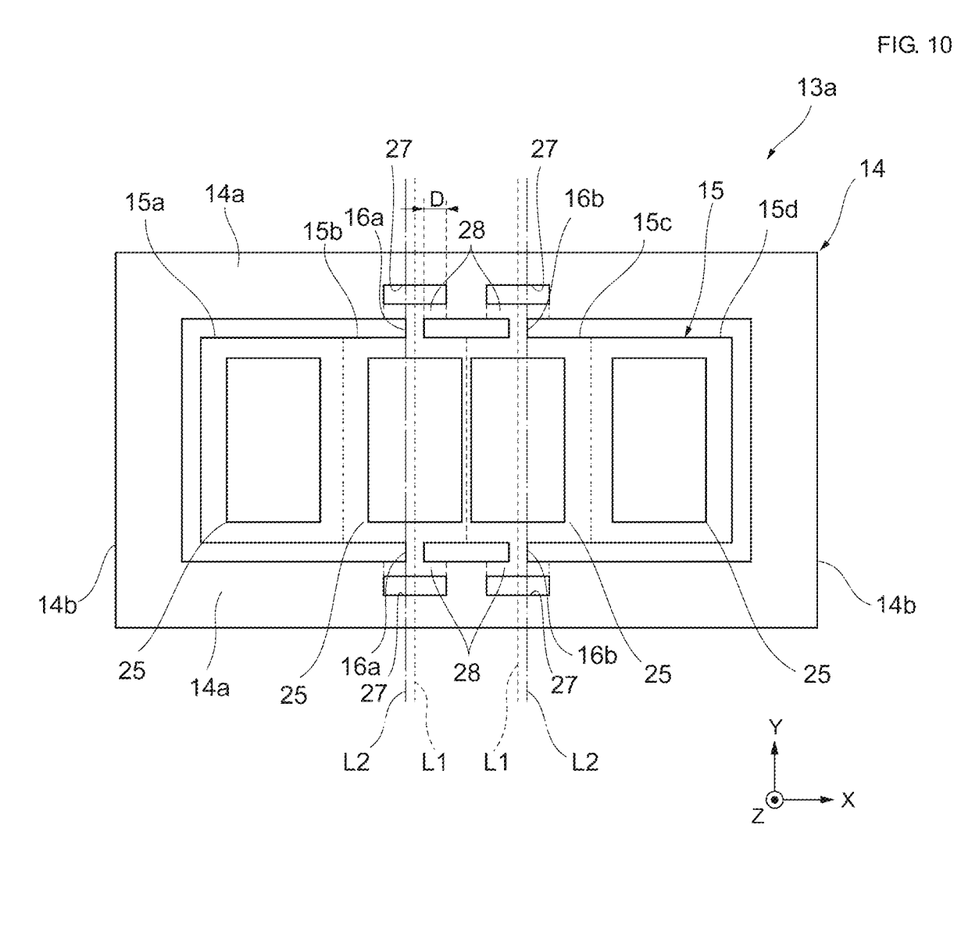
FIG. 10 is a plan view schematically illustrating the structure of a piezoelectric vibrator according to a second embodiment.

FIG. 10 is a plan view schematically illustrating the structure of a piezoelectric vibrator 13a according to a second embodiment. The difference between the piezoelectric vibrator 13 according to the first embodiment and the piezoelectric vibrator 13a is that the piezoelectric vibrator 13a has two pairs of slits 27 and 27, which extend in the X-axis direction and which are formed at positions corresponding to the two pairs of support portions 16a, 16a and 16b, 16b of the frame bodies 14a of the support frame 14, and bending-vibration portions 28, each of which is formed between one of the slits 27 and a corresponding one of the support portions 16a and 16b. The rest of the structure of the piezoelectric vibrator 13a is the same as that of the above-described piezoelectric vibrator 13 according to the first embodiment, and thus, repeated descriptions will be omitted.

Each of the slits 27 is a through hole extending through a corresponding one of the frame bodies 14a in the Z-axis direction. For example, each of the slits 27 has a rectangular shape elongated in the X-axis direction as its contour shape, and the center line of the slit 27 extending in the X-axis direction coincides with a corresponding one of the center lines L1 of the upper electrode films 25 and the support portions 16a and 16b. With the above-described configuration, the support portions 16a and 16b are connected to the support frame 14 by the bending-vibration portions 28. The bending-vibration portions 28 extend so as to be elongated in the X-axis direction perpendicular to the Y-axis direction. For example, each of the bending-vibration portions 28 has a length of 5 μm in the Y-axis direction and a width of 25 μm in the X-axis direction.

In the piezoelectric vibrator 13a, when vibration of the vibrating portion 15 is transmitted to the bending-vibration portions 28 via the support portions 16a and 16b, the vibration is converted into bending vibration in the Z-axis direction in the bending-vibration portions 28. Since the interfaces between the bending-vibration portions 28 and the corresponding frame bodies 14a indicated by dotted lines in FIG. 10 are fixed ends of the bending vibration, the bending vibration in the bending-vibration portions 28 is reflected by the interfaces, and the vibration is contained in the bending-vibration portions 28. As a result, the probability of the vibration of the vibrating portion 15 being transmitted to the frame bodies 14a can be effectively reduced.

Note that the distance D from each of the ends of the support portions 16a and 16b in the X-axis direction to a corresponding one of the interfaces between the bending-vibration portions 28 and the frame bodies 14a is set in accordance with the natural vibration frequency in the vibrating portion 15. More specifically, in the case where the wavelength of bending vibration corresponding to the natural vibration frequency of the vibrating portion 15 is λ, the distance D is set to λ/4. With the above-described configuration, vibration can be contained in the bending-vibration portions 28 with certainty. In addition, since the area of the support frame 14 outside the interfaces is large, the acoustic reflection effect can be improved, and as a result, vibration can be contained by the bending-vibration portions 28 with higher certainty.

Figure 11:
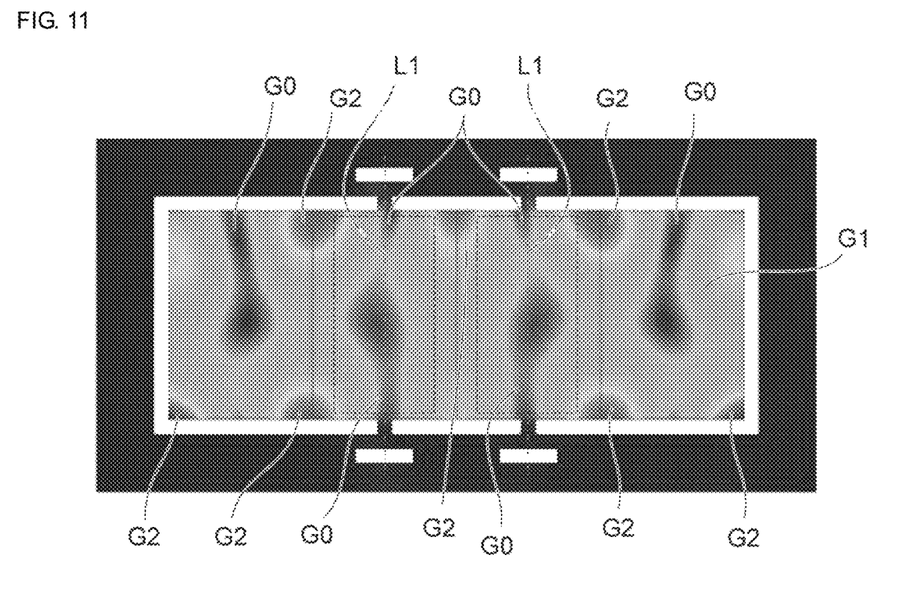
FIG. 11 is a diagram illustrating a simulation result of displacement of a vibrator according to a comparative example.
Figure 12:
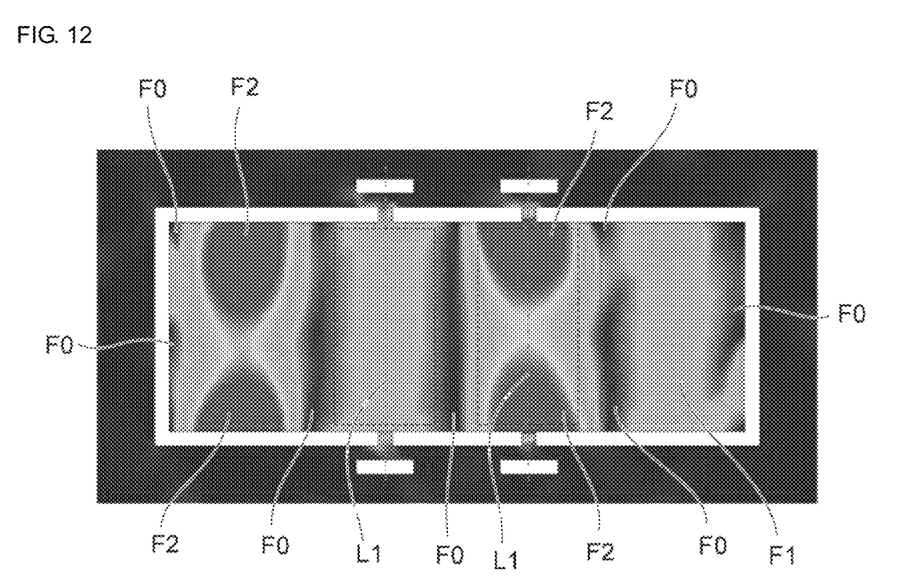
FIG. 12 is a diagram illustrating a simulation result of deformation of the vibrator according to the comparative example.
Figure 13:
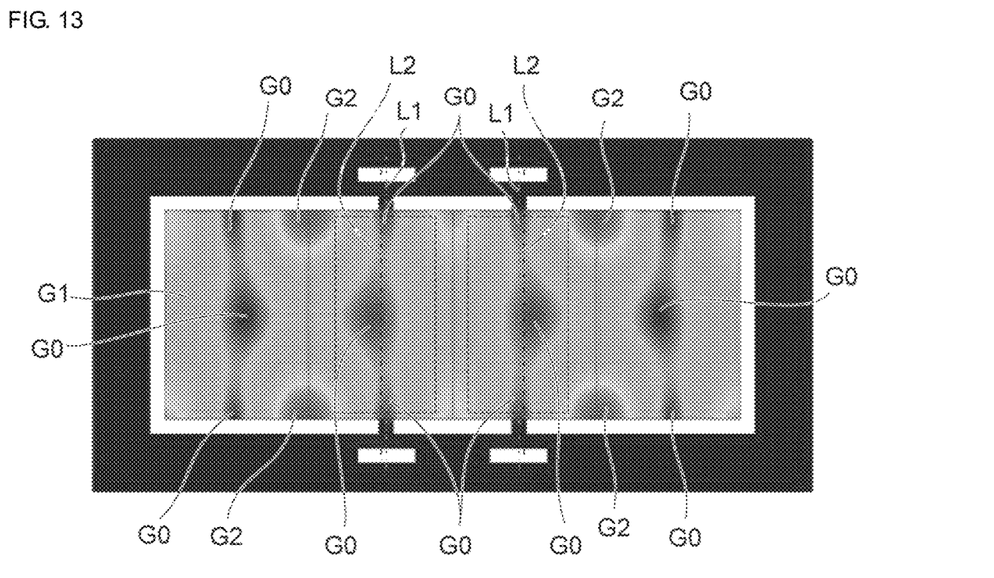
FIG. 13 is a diagram illustrating a simulation result of displacement of the vibrator according to one of the embodiments.
Figure 14:
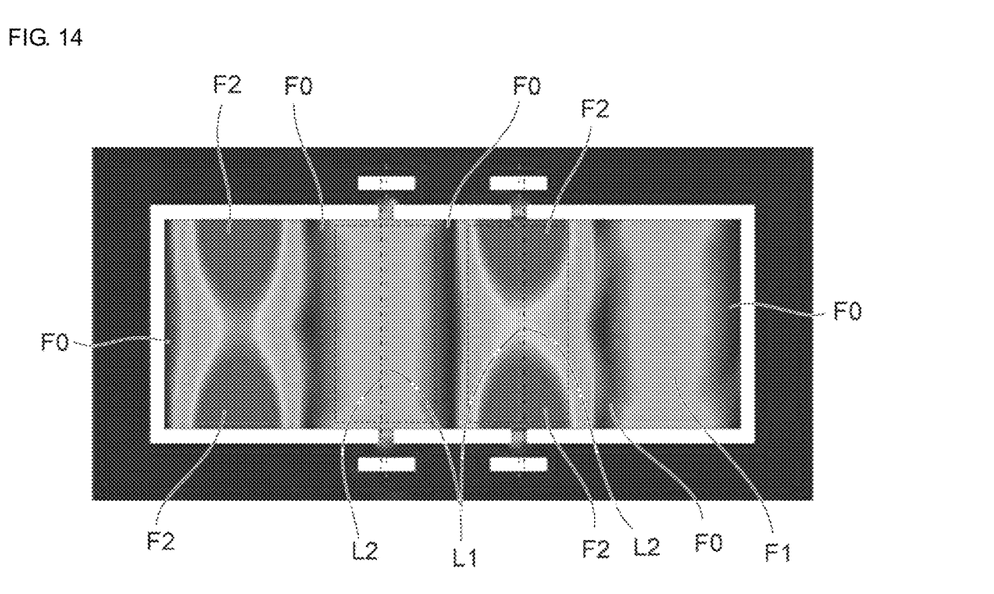
FIG. 14 is a diagram illustrating a simulation result of deformation of according to one of the embodiments.

FIG. 11 to FIG. 14 are diagrams illustrating the amounts of displacement and deformation of a width-expansion piezoelectric vibrator based on an FEM analysis simulation. FIG. 11 and FIG. 12 illustrate the amounts of displacement and deformation of the piezoelectric vibrator according to a comparative example, that is, in a case where each of the center lines L1 of the upper electrode films 25 and the support portions 16a and 16b coincides with the corresponding center line L2 of the vibration region 15b or 15c. FIG. 13 and FIG. 14 illustrate the amounts of displacement and deformation of the piezoelectric vibrator according to the embodiment (the second embodiment), that is, in a case where each of the center lines L1 of the upper electrode films 25 and the support portions 16a and 16b is offset inwardly from the corresponding center line L2 of the vibration region 15b or 15c.

In FIG. 11 and FIG. 13, minimum displacement regions, intermediate displacement regions, and maximum displacement regions were respectively determined as G0, G1, and G2. As a result, as illustrated in FIG. 11, in the comparative example, it is understood that the positions of the minimum displacement regions G0 in the vicinity of connecting positions of the support portions 16a and 16b are displaced inwardly from the corresponding central lines L1 of the upper electrode films 25 and the support portions 16a and 16b. In contrast, as illustrated in FIG. 13, in the embodiment, it is understood that the positions of the minimum displacement regions G0 in the vicinity of the connecting positions of the support portions 16a and 16b approximately coincide with the corresponding central lines L1 of the upper electrode films 25 and the support portions 16a and 16b.

In FIG. 12 and FIG. 14, minimum distortion regions, intermediate distortion regions, and maximum distortion regions were respectively determined as F0, F1, and F2. As a result, in the comparative example, it is understood that the central axes L1 of the upper electrode films 25 and the support portions 16a and 16b are slightly displaced outwardly from the corresponding centers of the positions of the maximum distortion regions F2 and the minimum distortion regions F0 as illustrated in FIG. 12. In contrast, in the embodiment, it is understood that the central axes L1 of the upper electrode films 25 and the support portions 16a and 16b approximately coincide with the corresponding centers of the positions of the maximum distortion regions F2 and the minimum distortion regions F0 as illustrated in FIG. 14. Note that, as is clear from FIG. 12 and FIG. 14, in the vibration regions 15a and 15d of the vibrating portion 15, the boundaries between the adjacent vibration regions are defined by the minimum distortion regions F0.

In the above-described piezoelectric vibrators 13 and 13a, even in the case where the vibrating portion 15 has five vibration regions, advantageous effects similar to those described above can be realized. In this case, it is preferable that an additional vibration region be formed between the above-described vibration regions 15b and 15c. In addition, in the case where a plurality of lower electrode films 24 are each formed so as to correspond to one of the vibration regions 15a and 15d instead of providing the above-described single lower electrode film 24, it is preferable that the lower electrode films 24 formed in or on the vibration regions 15b and 15c be offset inwardly in a similar manner to the above-described upper electrode films 25.

It is noted that each of the embodiments has been described above for ease of understanding of the present disclosure and is not intended to limit the scope of the present invention. Changes and improvements may be made to the present disclosure within the scope of the present invention, and the present invention includes equivalents thereof. In other words, design changes may be suitably made to the embodiments by those skilled in the art, and such embodiments are also within the scope of the present invention as long as they have the features of the present invention. For example, the elements included in the embodiments and the arrangements, materials, conditions, shapes, sizes and the like of the elements are not limited to those described above as examples, and they may be suitably changed. Each of the embodiments is an example, and it is obvious that the configurations according to the different embodiments may be partially replaced with one another or may be combined with each other, and other embodiments obtained as a result of such replacements and combinations are also within the scope of the present invention as long as they have the features of the present invention.

REFERENCE SIGNS LIST 13 vibrator (piezoelectric vibrator)
13a vibrator (piezoelectric vibrator)
14 support frame
15 vibrating portion
15a to 15d vibration region
16a support portion
16b support portion
25 electrode film (upper electrode film)
L1 center line
L2 center line

The invention claimed is:
1. A resonator comprising:
a support frame;
a rectangular vibrating plate that includes:
　a plurality of vibration regions arranged in a row in a first direction, and
　a plurality of electrodes respectively disposed in the plurality of vibration regions; and
at least two pairs of support arms with each pair disposed on opposite sides of the vibrating plate and that connect the vibrating plate to the support frame,
wherein center lines of at least two of the plurality of electrodes that extend in a second direction perpendicular to the first direction are offset relative to center lines of the corresponding vibration regions on which the at least two electrodes are disposed, the center lines of the vibration regions also extending in the second direction, and
wherein each of the plurality of vibration regions are configured to vibrate with a phase opposite to phases of adjacent vibration regions upon excitation.
2. The resonator according to claim 1, wherein the rectangular vibrating plate is configured to perform contour vibration upon excitation.
3. The resonator according to claim 1, wherein the center lines of the at least two electrodes in the second direction coincides with a minimum displacement point in the corresponding vibration regions.
4. The resonator according to claim 1, wherein the at least two electrodes are disposed between the at least two pairs of support arms, respectively, such that center lines each pair of the support arms extending the second direction are offset from the center lines of the corresponding vibration region relative to the first direction.
5. The resonator according to claim 4, wherein the center lines of each pair of the support arms extending in the second direction coincides with the center line of the corresponding electrode.
6. The resonator according to claim 1, wherein a ratio of a width of each of the electrodes in the first direction to a width of a corresponding vibration region on which the electrode is disposed, in the first direction, is not less than 0.6 and not more than 0.9.
7. The resonator according to claim 6, wherein the ratio is not less than 0.7 and not more than 0.8.
8. The resonator according to claim 1,
wherein the vibrating plate has first and second opposing sides that extend in the first direction, and
wherein each of the pairs of support arms includes a first support arm and a second support arm that connect the support frame to the first side and the second side, respectively, of the vibrating plate.
9. The resonator according to claim 1, wherein the at least two electrodes with the center lines offset relative to center lines of the corresponding vibration regions are not located in outermost vibration regions relative to the first direction.
10. The resonator according to claim 1, wherein the corresponding vibration regions on which the at least two electrodes are disposed are connected to the at least two pairs of support arms, respectively.
11. The resonator according to claim 1, wherein the center line of each of the at least two electrodes is inwardly disposed from the center line of the corresponding vibration region relative to the first direction.
12. The resonator according to claim 1, further comprising two pairs of slits in the support frame that extend in the first direction and face the at least two pairs of support arm, respectively,
wherein the at least two pairs of support arms connect the corresponding vibration regions on which the at least two electrodes are disposed, respectively, and
wherein center lines of the pairs of slits extending in the second direction are offset from the center lines of the corresponding vibration regions, respectively.
13. The resonator according to claim 1, wherein the vibration portion further includes:
at least four piezoelectric elements on which the plurality of electrodes are disposed, respectively; and
a common electrode in the vibration regions, wherein the common electrode is disposed on the piezoelectric elements and opposite from the plurality of electrodes.
14. A resonator comprising:
a support frame;
a rectangular vibrating plate that performs contour vibration in a first direction upon excitation; and
two pairs of support arms that connect opposing sides of the vibrating plate to the support frame,
wherein the vibrating plate includes at least four vibration regions arranged in a row in the first direction, each of the at least four vibration regions being configured to vibrate with a phase opposite to phases with which the adjacent vibration regions vibrate upon excitation, wherein a center line of each of the pair of support arms extending in a second direction perpendicular to the first direction is offset from a center line extending in the second direction of corresponding regions disposed between the respective pair of support arms.

15. The resonator according to claim 14, wherein each of the at least four vibration regions have a same width in the first direction and a same length in the second direction relative to each other.

16. The resonator according to claim 15, wherein the center line of each of the support arms in the first direction coincides with a minimum displacement point in the corresponding vibration region connected to the respective support arm.

17. The resonator according to claim 15, wherein the center line of each of the pair of support arms in the first direction is inwardly disposed from the center line of the corresponding vibration portion relative to the first direction.

18. A resonator comprising:
 a support frame;
 a rectangular vibrating plate connected to the support frame by at least one pair of support arms coupled to opposing sides of the vibrating plate; and at least four electrodes disposed adjacent to each other in a lengthwise direction of the vibrating plate, wherein a distance between an inner pair of electrodes of the at least four electrodes is different than a distance between each of the inner electrodes and respective outer electrodes of the at least four electrodes relative to the lengthwise direction.

19. The resonator according to claim 18,
 wherein the vibrating plate includes a plurality of vibration regions arranged in a row in the lengthwise direction with each of the at least four electrodes disposed on a respective vibration region of the plurality of vibration regions, and
 wherein center lines of the inner electrodes that extend in a widthwise direction of the vibrating plate are offset relative to center lines of the corresponding vibration regions on which the inner electrodes are disposed.

20. The resonator according to claim 18, wherein the distance between the inner pair of electrodes of the at least four electrodes is less than the distance between each of the inner electrodes and the respective outer electrodes of the at least four electrodes relative to the lengthwise direction.

* * * * *